United States Patent
Samid et al.

(10) Patent No.: US 8,552,899 B2
(45) Date of Patent: Oct. 8, 2013

(54) ANALOG-DIGITAL CONVERSION

(75) Inventors: Lourans Samid, Heilbronn (DE);
Johannes Schaefer, Ulm (DE); Thomas Janz, Ulm (DE)

(73) Assignee: Atmel Automotive GmbH, Heilbronn (DE)

( * ) Notice: Subject to any disclaimer, the term of this patent is extended or adjusted under 35 U.S.C. 154(b) by 40 days.

(21) Appl. No.: 13/236,417

(22) Filed: Sep. 19, 2011

(65) Prior Publication Data

US 2012/0075135 A1      Mar. 29, 2012

Related U.S. Application Data

(60) Provisional application No. 61/386,162, filed on Sep. 24, 2010.

(30) Foreign Application Priority Data

Sep. 23, 2010  (DE) .......................... 10 2010 046 187

(51) Int. Cl.
*H03M 1/12* (2006.01)
(52) U.S. Cl.
USPC .......................................... 341/155; 341/159
(58) Field of Classification Search
CPC ................................... H03M 3/30; H03M 1/12
USPC ................................................. 341/155, 159
See application file for complete search history.

(56) References Cited

U.S. PATENT DOCUMENTS

| | | | |
|---|---|---|---|
| 5,289,257 A * | 2/1994 | Kurokawa et al. | 356/463 |
| 6,647,075 B1 * | 11/2003 | Genrich | 375/316 |
| 6,683,904 B2 * | 1/2004 | Linder et al. | 375/139 |
| 2010/0195669 A1 | 8/2010 | Tzeng | |

FOREIGN PATENT DOCUMENTS

| | | |
|---|---|---|
| DE | 100 42 959 C1 | 1/2002 |
| DE | 102010046187.3-56 | 9/2010 |
| EP | 1 993 212 B1 | 5/2008 |

OTHER PUBLICATIONS

Office Action for German Patent Application 10 2010 046 187.3, May 3, 2011.
English Abstract for DE 100 42 959, Jan. 3, 2002.
Andraka, R. "A Survey of CORDIC Algorithms for FPGA Based Computers," *FPGA '98, Proceedings of the 1998 ACM/SIGDA Sixth International Symposium on Field Programmable Gate Arrays*, Feb. 22-24, 1998.
Seifart, Manfred, "Analog Circuits," Verlag Technik, 6th ed., pp. 568-575, 2003.

* cited by examiner

*Primary Examiner* — Brian Young
(74) *Attorney, Agent, or Firm* — Baker Botts LLP

(57) ABSTRACT

In one embodiment, a method includes receiving a first analog signal at a first input; receiving a second analog signal at a second input; mixing the first analog signal with a first oscillator signal having a first frequency; mixing the second analog signal with a second oscillator signal having a second frequency; converting a sum signal to a digital signal; generating a first control signal based on a first digital value of a first function and the digital signal; and generating a second control signal based on a second digital value of a second function and the digital signal.

19 Claims, 7 Drawing Sheets

US 8,552,899 B2

ANALOG-DIGITAL CONVERSION

RELATED APPLICATIONS

This application claims the benefit, under 35 U.S.C. §119(e), of U.S. Provisional Patent Application No. 61/386,162, filed 24 Sep. 2010. This application also claims the benefit, under 35 U.S.C. §119(a), of German Patent Application No. 102010046187.3-56, filed 23 Sep. 2010.

TECHNICAL FIELD

This disclosure relates to analog-to-digital conversion.

BACKGROUND

An analog-to-digital converter (ADC) is an electronic device that converts an input analog signal to a digital signal.

DESCRIPTION OF EXAMPLE EMBODIMENTS

Figure 1:
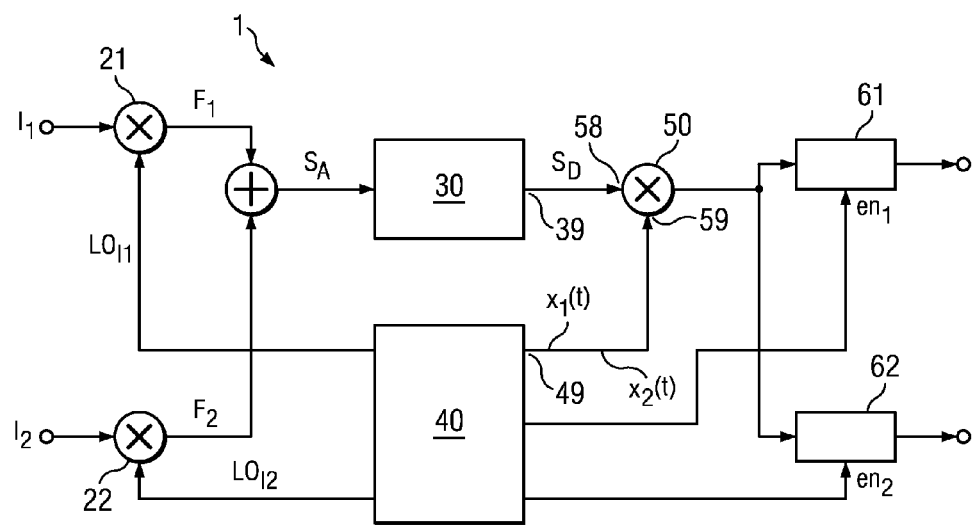
FIG. 1 is a schematic diagram of a first example embodiment.

This disclosure relates to a circuit for analog-digital conversion.

A Delta-Sigma analog-digital converter is described in MANFRED SEIFART, ANALOG CIRCUITS 568-575 (6th ed. 2003). Analog-digital (AD) converters are also known as AD converters (ADC). The Delta-Sigma ADC has, for example, an analog modulator and a digital (lowpass) filter/decimator and outputs the digital data with the required word width, for example, at a pulse-code modulation (PCM) output.

European Patent No. EP 1993212 describes a converter device for converting an analog direct current (DC) voltage signal into a digital signal. There is provided an oscillator device for outputting a first oscillator signal and a second oscillator signal, wherein the first oscillator signal and the second oscillator signal are fixed in phase with each other and are generated with the same frequency from a reference signal. Connected to the oscillator device is an analog frequency converter in the form of an analog mixer. The frequency converter may convert the analog DC voltage signal by means of the first oscillator signal into a converted signal in a first spectral region with a first center frequency. The converter device has an analog/digital converter for converting the converted signal into a converted digital signal. The converter device has a frequency converter, connected to the oscillator device, for converting the converted digital signal by means of the second oscillator signal into a second spectral region with a second center frequency, in order to obtain the digital signal.

The COordinate Rotation Digital Computer (CORDIC) algorithm and possible hardware implementations, such as for generating the values of a sine function or a cosine function, are described in R. Andraka, *A Survey of CORDIC Algorithms for FPGA Based Computers*, PROCEEDINGS OF THE 1998 ACM/SIGDA SIXTH INTERNATIONAL SYMPOSIUM ON FIELD PROGRAMMABLE GATE ARRAYS, Feb. 22-24, 1998, at 191-200.

Particular embodiments provide an improved circuit for analog-digital conversion. In particular embodiments, the circuit has a first analog mixer that may mix a first analog signal with a first oscillator signal. The first oscillator signal has a first frequency. The circuit has a second analog mixer that may mix a second analog signal with a second oscillator signal. The second oscillator signal has a second frequency. The first frequency and the second frequency are different. In particular embodiments, the first mixer and the second mixer are configured as passive mixers.

In particular embodiments, the circuit has an ADC for converting an analog sum signal into a digital signal. The ADC may work by a method that has the necessary bandwidth for the converting of the mixed signals. In particular embodiments, the ADC is a Delta-Sigma ADC. The analog sum signal has a first analog output signal of the first analog mixer as the first summand and a second analog output signal of the second analog mixer as the second summand.

In particular embodiments, the circuit has a control device for outputting the first oscillator signal and the second oscillator signal. For this outputting, the control device is connected to the first mixer and to the second mixer. In particular embodiments, for example, the first oscillator signal and the second oscillator signal are output as a differential signal.

In particular embodiments, the control device may output first digital values of a first sine function, timed by a clock signal. The first sine function has the first frequency. The control device may output second digital values of a second sine function, timed by the clock signal. The second sine function has the second frequency. In particular embodiments, an amplitude modulation is carried out by means of the first oscillator signal and likewise an amplitude modulation is carried out by the second oscillator signal.

In particular embodiments, the circuit has a digital multiplier, whose first input is connected to an output of the ADC and whose second input is connected to an output of the control device. The digital multiplier may multiply the digital signal with the first digital values of the first sine function and, offset in time, to multiply the digital signal with the second digital values of the second sine function. The digital multiplier, the ADC, and the control device are interconnected so that the multiplying of the first values with the digital signal and the multiplying of the second values with the digital signal occurs by means of the very same multiplier.

In particular embodiments, the control device may output the second digital values offset in time between the first digital values by at least one clock period of the clock signal. In particular embodiments, for example, the first digital values and the second digital values are output in alternation, i.e., disjointed in time. In particular embodiments, the first digital values and the second digital values are not output at the same time.

Particular embodiments of the circuit have a first register and a second register that are connected to an output of the digital multiplier. The control device may place the results of the multiplication of the digital signal with the first digital values in the first register by controlling the first register by means of a first control signal. In particular embodiments, the control device may place the results of the multiplication of the digital signal with the second digital values in the second register by controlling the second register by means of a second control signal.

Figure 4:
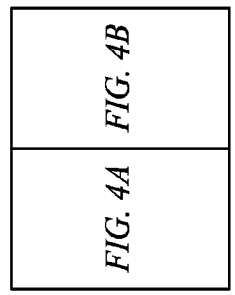
FIG. 4 is a schematic diagram of a third example embodiment.

In FIG. 4, particular example embodiments require only a single ADC. In particular embodiments, only a small number of ADCs are required, so that a plurality of input analog signals may be evaluated by one and the same multiplier. Due to the arrangement of particular embodiments, the required chip surface for the circuit is significantly reduced. The number of ADCs and that of digital multipliers is furthermore independent of the number of analog signals being converted, so that the circuit may be expanded to almost any given number of analog signals, yet each digital value of the respective analog signal being converted may be output with only slight delay.

In particular embodiments, the control device may output the first values and the first control signal synchronized in time. In particular embodiments, the control device is likewise designed to output the second values and the second control signal synchronized in time.

In particular embodiments, the circuit has a first analog input for inputting a first analog input signal and a second analog input for inputting a second analog input signal. In particular embodiments, for example, the circuit has a first input circuit that is connected to the first analog input to form the first analog signal from the first analog input signal. In particular embodiments, the circuit has a second input circuit that is connected to the second analog input to form the second analog signal from the second analog input signal. In particular embodiments, each input circuit has an impedance matching or a protective circuit, such as an electrostatic discharge (ESD) protective circuit. In particular embodiments, each input circuit has a filter or a voltage to current converter or a current to voltage converter.

In particular embodiments, the circuit may have a third analog mixer that may mix a third analog signal with a third oscillator signal. The third oscillator signal likewise has the first frequency. The third oscillator signal is phase-shifted by 90° relative to the first oscillator signal. If the first oscillator signal is termed the in-phase signal, then the third oscillator signal may be termed the corresponding quadrature-phase signal.

In particular embodiments, the circuit may have a fourth analog mixer that may mix a fourth analog signal with a fourth oscillator signal. The fourth oscillator signal likewise has the second frequency. The fourth oscillator signal is phase-shifted by 90° relative to the second oscillator signal. The analog output signals of the third mixer and the fourth mixer are likewise added. Consequently, the sum signal also has the third output signal of the third mixer as the third summand and the fourth output signal of the fourth mixer as the fourth summand.

In particular embodiments, the control device outputs third values of a first cosine function in clock rhythm. The first cosine function may have the first frequency. Furthermore, the control device outputs fourth values of a second cosine function in clock rhythm. The second cosine function has the second frequency.

In particular embodiments, the control device may output the third values and the fourth values offset in time between the first values and the second values by at least one clock period. In particular embodiments, for example, one of the first values is output with a first clock pulse, one of the third values with the following clock pulse, one of the second values with the following clock pulse, and one of the fourth values with the clock pulse after that. In particular embodiments, the digital multiplier may multiply the digital signal with the third values of the first cosine function and the fourth values of the second cosine function.

In particular embodiments, the control device may place the results of the multiplication with the third values in the third register by controlling the third register by means of a third control signal and the results of the multiplication with the fourth values in the fourth register by controlling the fourth register by means of a fourth control signal.

In particular embodiments, the control device may output third values of a first cosine function synchronized in time with the first values by the clock signal. The first cosine function has the first frequency. In particular embodiments, the control device may output fourth values of a second cosine function synchronized in time with the second values by the clock signal. The second cosine function has the second frequency.

In particular embodiments, the circuit has another digital multiplier, whose first input is connected to the output of the ADC and whose second input is connected to another output of the control device. In particular embodiments, the multiplier may be hooked up to multiply the digital signal with the third values of the first cosine function and the fourth values of the second cosine function, so that the multiplication of the digital signal with the third values and the multiplication of the digital signal with the fourth values is done with the same additional multiplier.

In particular embodiments, the circuit has a third register and a fourth register. In particular embodiments, the control device may place the results of the multiplication of the digital signal with the third values in the third register by controlling the third register by means of a third control signal. In particular embodiments, the control device may place the results of the multiplication of the digital signal with the fourth values in the fourth register by controlling the fourth register by means of a fourth control signal.

In particular embodiments, the control device is designed for a time delayed outputting or a phase rotation of the first oscillator signal relative to the first values or of the second oscillator signal relative to the second values or of the third oscillator signal relative to the third values or of the fourth oscillator signal relative to the fourth values.

In particular embodiments, the control device is designed for a time delayed outputting or a phase rotation of the first values relative to the first oscillator signal or of the second values relative to the second oscillator signal or of the third values relative to the third oscillator signal or of the fourth values relative to the fourth oscillator signal. By adjusting the delay for the outputting or the phase rotation, in particular embodiments, the signal delay may be equalized by the ADC. In particular embodiments, for example, the values or oscillator signals are generated directly by the control device with a rotated phase. In particular embodiments, the control device may have an adjustable delay device for the adjustable time delaying of the outputting of the first oscillator signal or the second oscillator signal or the third oscillator signal or the fourth oscillator signal or the first values or the second values or the third values or the fourth values.

In particular embodiments, the control device has a generator device with a CORDIC algorithm for outputting the first values or the second values or the third values or the fourth values or the first oscillator signal or the second oscillator signal or the third oscillator signal or the fourth oscillator signal. In particular embodiments, the generator device may generate the values and oscillator signals with the adjusted phase rotation.

In particular embodiments of the analog-digital conversion, the circuit has connections to hook up battery cells. The battery cells are connected in series, in particular embodiments, and the circuit monitors each cell potential of each individual battery cell. In particular example embodiments, an almost undelayed monitoring of all cell potentials may be achieved with the circuit of FIG. 2.

Particular embodiments provided are advantageous both individually and in combination. Particular embodiments may be combined with each other. Some possible combinations are discussed in the specification of the example embodiments of the figures. However, these options of combinations of the particular embodiments depicted are not conclusive.

FIG. 1 shows a simple example embodiment as a block diagram. The circuit 1 has a Delta-Sigma ADC 30 that may convert the analog sum signal $S_A$ into a digital signal $S_D$ and present it at the output 39. In particular embodiments, the circuit 1 has a first analog mixer 21 and a second analog mixer 22. The first analog mixer 21 may mix a first analog signal $I_1$ with a first oscillator signal $LO_{f1}$. In particular embodiments, the first oscillator signal $LO_{f1}$ has a first frequency $f_1$.

In particular embodiments, the second analog mixer 22 may mix a second analog signal $I_2$ with a second oscillator signal $LO_{f2}$. The second oscillator signal $LO_{f2}$ has a second frequency $f_2$. The first frequency $f_1$ and the second frequency $f_2$ are different. In particular embodiments, for example, the first frequency $f_1$ and the second frequency $f_2$ may differ by 10 kHz.

In particular embodiments, the circuit may add a first analog output signal $F_1$ of the first analog mixer 21 and a second analog output signal $F_2$ of the second analog mixer 22 and to form a sum signal $S_A$. In particular embodiments, for example, the circuit 1 has, for the summation, an analog voltage adder or a node for the summation of analog currents as output signals $F_1$, $F_2$. The Delta-Sigma ADC 30 may convert the sum signal $S_A$ into a digital signal $S_D$. The digital signal $S_D$ contains the information of both input analog signals $I_1$, $I_2$ that are again separated into two registers 61 and 62 by means of a digital multiplier 50 and a control device 40.

In particular embodiments, the control device 40 may output the first oscillator signal $LO_{f1}$ to the first mixer 21 and the second oscillator signal $LO_{f2}$ to the second mixer 22. In particular embodiments, the control device 40 may output first digital values $X_1(t)$ of a first sine function, having the first frequency $f_1$, and second digital values $X_2(t)$ of a second sine function, having the second frequency $f_2$, to the input 59 of the digital multiplier 50. The outputting of the first digital values $X_1(t)$ and the second digital values $X_2(t)$ at the output 49 of the control device 40 is timed by a clock signal CLK, as is shown, for example, in FIG. 3. For the multiplication of the digital signal $S_D$ with the first values $X_1(t)$ and the second values $X_2(t)$, a first input 58 of the digital multiplier 50 is connected to the output 39 of the Delta-Sigma ADC 30.

In particular embodiments, in order to separate the digital information in the digital signal $S_D$, the control device 40 may output the second values $X_2(t)$ offset in time between the first values $X_1(t)$. Thus, the second values $X_2(t)$ and the first values $X_1(t)$ are not output at the same (clock) time. In particular embodiments, the control device 40 may output the second values $X_2(t)$ and the first values $X_1(t)$ offset by at least one clock period $T_{CLK}$ of the clock signal CLK, as is shown schematically, for example, in FIG. 3.

In particular embodiments, the first register 61 is driven by the control device 40 by means of a first control signal $en_1$ synchronized with the outputting of the first values $X_1(t)$. The multiplication result for each of the first values $X_1(t)$ is placed in the first register 61. In particular embodiments, the second register 62 is driven by the control device 40 by means of a second control signal $en_2$ synchronized with the outputting of the second values $X_2(t)$. The multiplication result for each of the second values $X_2(t)$ is placed in the second register 62.

Figure 2:
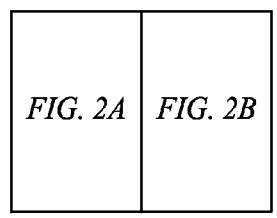
FIG. 2 is a schematic diagram of a second example embodiment.
Figure 2A:
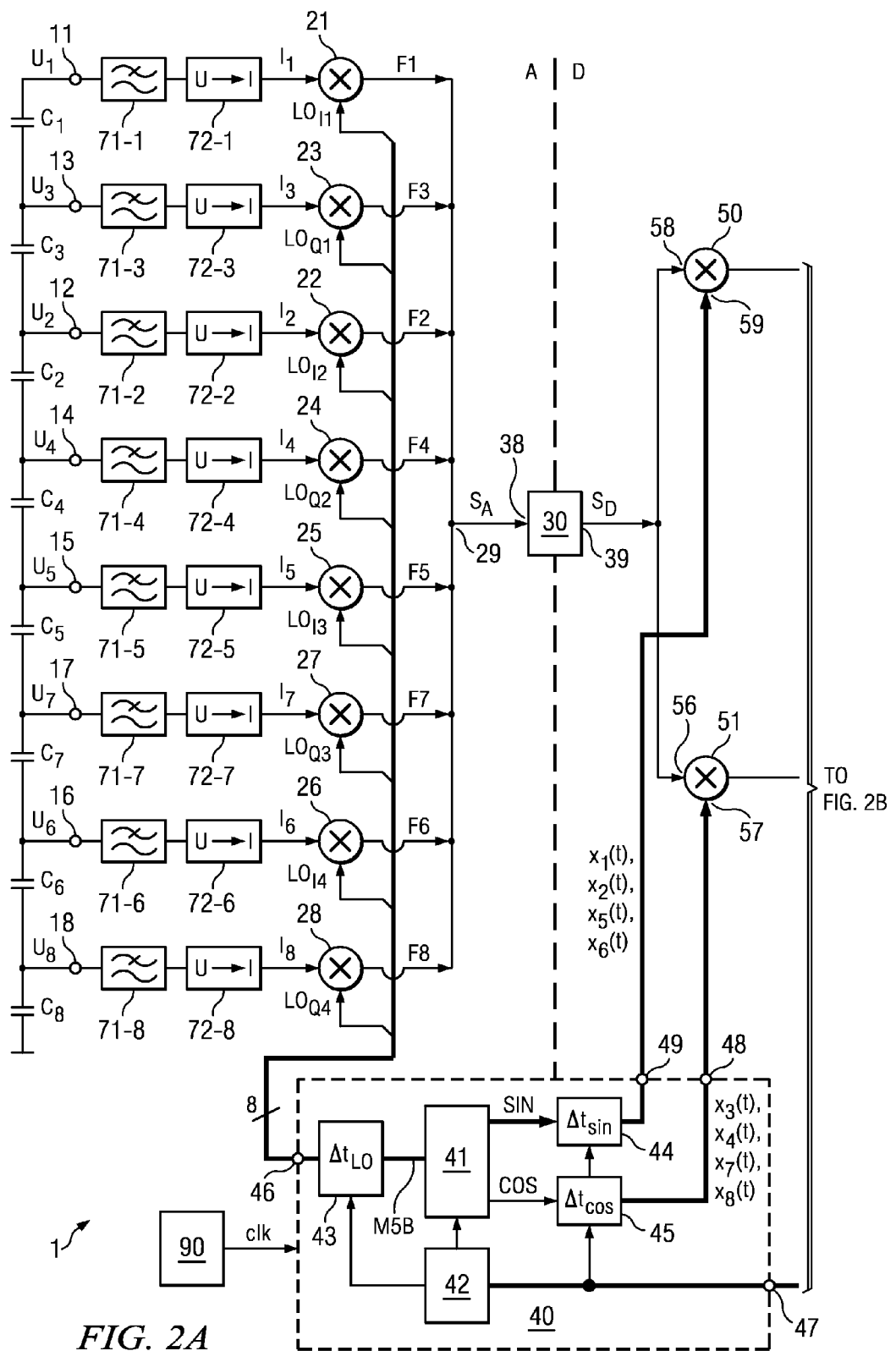
FIG. 2A is a portion of a schematic diagram of the second example embodiment.
Figure 2B:
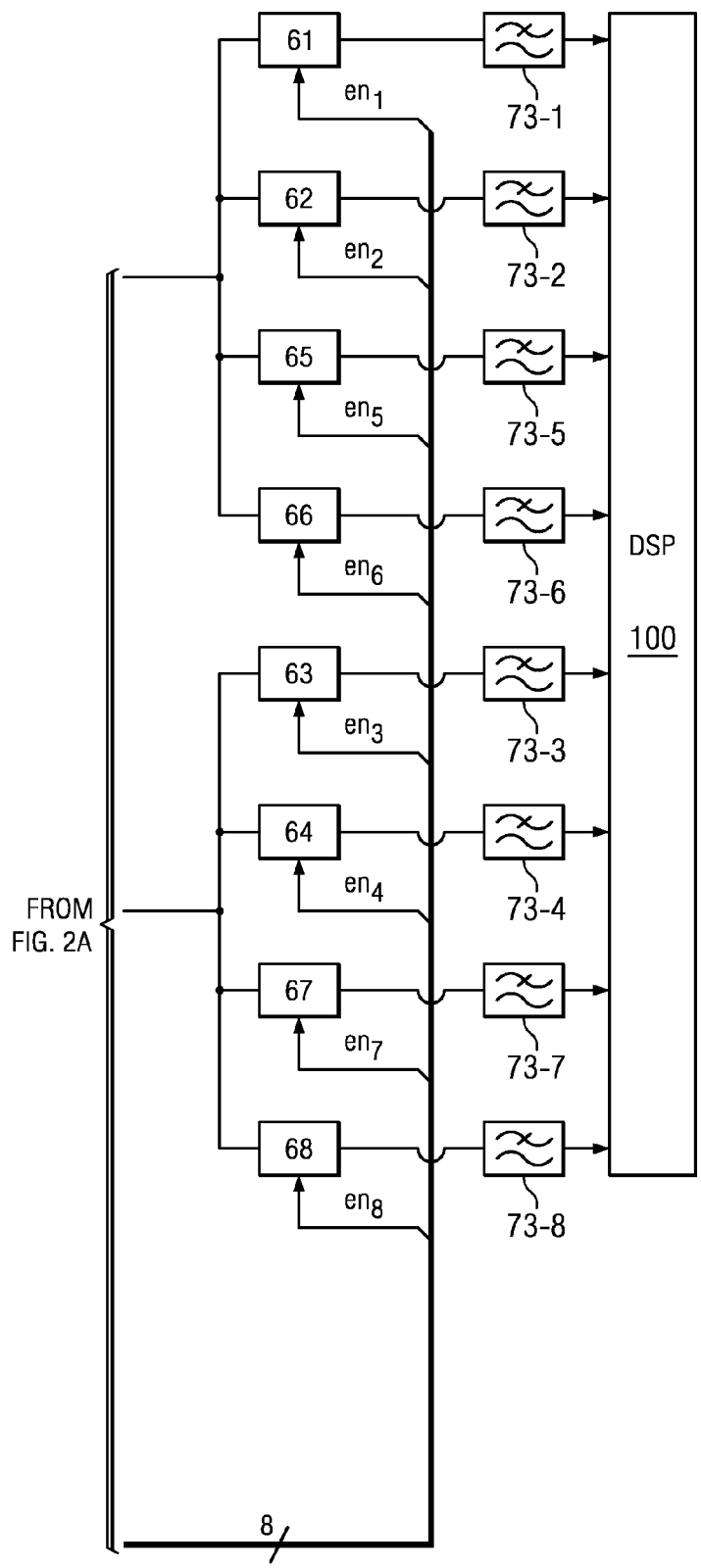
FIG. 2B is a second portion of a schematic diagram of the second example embodiment.

FIG. 2 shows an example embodiment of a circuit 1 for analog-digital conversion of eight potentials $U_1$, $U_2$, $U_3$, $U_4$, $U_5$, $U_6$, $U_7$, $U_8$ of eight battery cells C1, C2, C3, C4, C5, C6, C7, C8.

In particular embodiments, the circuit 1 has a first analog input 11 for inputting of a first analog input signal $U_1$, the first input signal $U_1$ corresponding to the first cell potential $U_1$ of the first battery cell C1. The circuit 1 has a second analog input 12 for inputting of a second analog input signal $U_2$, the second input signal $U_2$ corresponding to the second cell potential $U_2$ of the second battery cell C2. The circuit 1, furthermore, has a third analog input 13 for inputting of a third analog input signal $U_3$, the third input signal $U_3$ corresponding to the third cell potential $U_3$ of the third battery cell C3. Moreover, the circuit 1 has a fourth analog input 14 for inputting of a fourth analog input signal $U_4$, the fourth input signal $U_4$ corresponding to the fourth cell potential $U_4$ of the fourth battery cell C4.

FIG. 2 shows example analog inputs 15, 16, 17, 18 for the cell potentials $U_5$, $U_6$, $U_7$, $U_8$. In particular embodiments, the circuit 1 may be configured for a larger or smaller number of analog inputs. In FIG. 2, each analog input 11, 12, 13, 14, 15, 16, 17, 18 is connected in series to an analog lowpass filter 71-1, 71-2, 71-3, 71-4, 71-5, 71-6, 71-7, 71-8 to filter out interfering signals. Each analog lowpass filter 71-1, 71-2, 71-3, 71-4, 71-5, 71-6, 71-7, 71-8 is connected in series to an analog voltage to current converter 72-1, 72-2, 72-3, 72-4, 72-5, 72-6, 72-7, 72-8. The voltage to current converter 72-1, 72-2, 72-3, 72-4, 72-5, 72-6, 72-7, 72-8 may convert the filtered voltage at the output of the respective analog lowpass filter 71-1, 71-2, 71-3, 71-4, 71-5, 71-6, 71-7, 71-8 into a proportional current $I_1$, $I_2$, $I_3$, $I_4$, $I_5$, $I_6$, $I_7$, $I_8$ (as the analog signals $I_1$, $I_2$, $I_3$, $I_4$, $I_5$, $I_6$, $I_7$, $I_8$).

In particular embodiments, the circuit 1 has a first analog mixer 21 that is connected to the first analog input 11 across the lowpass filter 71-1 and the voltage to current converter 72-1. In particular embodiments, the first mixer 21 may mix a first analog signal $I_1$ with a first oscillator signal $LO_{f1}$. The first analog signal $I_1$ is the first output current $I_1$ of the first voltage to current converter 72-1. The first oscillator signal $LO_{f1}$ has a first frequency $f_1$, such as 100 kHz. In particular embodiments, the first analog mixer 21 may be any analog frequency converter that may convert the first analog signal $I_1$ by means of the first oscillator signal $LO_{f1}$ into a first converted signal $F_1$ in a first spectral region with a first center frequency.

In particular embodiments, the circuit 1 has a second analog mixer 22 that is connected to the second analog input 12 across the lowpass filter 71-2 and the voltage to current converter 72-2. The second mixer 22 may mix the second analog signal $I_2$ with a second oscillator signal $LO_{f2}$. The second analog signal $I_2$ is the second output current $I_2$ of the second voltage to current converter 72-2. In particular embodiments, the second oscillator signal $LO_{f2}$ has a second frequency $f_2$, such as 110 kHz. In particular embodiments, the second analog mixer 22 may be any analog frequency converter that may convert the second analog signal $I_2$ by means of the second oscillator signal $LO_{f2}$ into a second converted signal $F_2$ in a second spectral region with a second center frequency.

In particular embodiments, the circuit 1 has a third analog mixer 23 that is connected to the third analog input 13 across the lowpass filter 71-3 and the voltage to current converter 72-3. The third mixer 23 may mix the third analog signal $I_3$ with a third oscillator signal $LO_{Q1}$. The third analog signal $I_3$ is the third output current $I_3$ of the third voltage to current converter 73-2. In particular embodiments, the third oscillator signal $LO_{Q1}$ has the first frequency $f_1$ and is phase-shifted by 90° (quadrature-phase signal) relative to the first oscillator signal $LO_{I1}$ (in-phase signal). In particular embodiments, the third analog mixer 23 may be any analog frequency converter that may convert the third analog signal $I_3$ by means of the third oscillator signal $LO_{Q1}$ into a third converted signal $F_3$ in the first spectral region with the first center frequency. The first oscillator signal $LO_{I1}$ and the third oscillator signal $LO_{Q1}$ may be, for example, square-wave signals with the first frequency $f_1$ that are 90° phase-shifted relative to each other.

In particular embodiments, the circuit 1 has a fourth analog mixer 24 that is connected to the fourth analog input 14 across the lowpass filter 71-4 and the voltage to current converter 72-4. The fourth mixer 24 may mix the fourth analog signal $I_4$ with a fourth oscillator signal $LO_{Q2}$. The fourth analog signal $I_4$ is the fourth output current $I_4$ of the fourth voltage to current converter 74-2. In particular embodiments, the fourth oscillator signal $LO_{Q2}$ has the second frequency $f_2$ and is phase-shifted by 90° (quadrature-phase signal) relative to the second oscillator signal $LO_{I2}$ (in-phase signal). In particular embodiments, the fourth analog mixer 24 may be any analog frequency converter that may convert the fourth analog signal $I_4$ by means of the fourth oscillator signal $LO_{Q2}$ into a fourth converted signal $F_4$ in the second spectral region with the second center frequency. The second oscillator signal $LO_{I2}$ and the fourth oscillator signal $LO_{Q2}$ may be, for example, square-wave signals with the second frequency $f_2$ that are 90° phase-shifted relative to each other.

In particular embodiments illustrated in FIG. 2, the circuit 1 has a fifth mixer 25 for converting a fifth analog signal $I_5$ by means of a fifth oscillator signal $LO_{I3}$ with a third frequency $f_3$, such as 120 kHz, into a fifth converted signal $F_5$ and a seventh mixer 27 for converting a seventh analog signal $I_7$ by means of a seventh oscillator signal $LO_{Q3}$ with the third frequency $f_3$ into a seventh converted signal $F_7$. In particular embodiments, the fifth oscillator signal $LO_{I3}$ and the seventh oscillator signal $LO_{Q3}$ may be 90° phase-shifted relative to each other.

In particular embodiments illustrated in FIG. 2, the circuit 1 has a sixth mixer 26 for converting a sixth analog signal $I_6$ by means of a sixth oscillator signal $LO_{I4}$ with a fourth frequency $f_4$, such as 130 kHz, into a sixth converted signal $F_6$ and an eighth mixer 28 for converting an eighth analog signal $I_8$ by means of an eighth oscillator signal $LO_{Q4}$ with the fourth frequency $f_4$ into an eighth converted signal $F_8$. In particular embodiments, the sixth oscillator signal $LO_{I4}$ and the eighth oscillator signal $LO_{Q4}$ may be are 90° phase-shifted relative to each other.

In particular embodiments, the first frequency $f_1$, the second frequency $f_2$, the third frequency $f_3$ and the fourth frequency $f_4$ are all different from each other.

In FIG. 2, the converted signals F1, F2, F3, F4, F5, F6, F7, F8 may be currents that are added in the node 29. In particular embodiments, voltages may also be added by means of an analog adder (not shown). In FIG. 2, the analog mixers 21, 22, 23, 24, 25, 26, 27, 28 may be configured as passive mixers. In particular embodiments, for example, each analog mixer 21, 22, 23, 24, 25, 26, 27, 28 has four field-effect transistors that are switched by the respective oscillator signal $LO_{I1}$, $LO_{Q1}$, $LO_{I2}$, $LO_{Q2}$, $LO_{I3}$, $LO_{Q3}$, $LO_{I4}$, $LO_{Q4}$. In particular embodiments, the mixers 21, 22, 23, 24, 25, 26, 27, 28 are configured for differential output signals $F_1, F_2, F_3, F_4, F_5, F_6, F_7, F_8$ (not shown in FIG. 2).

In particular embodiments, the circuit illustrated in FIG. 2 may have a Delta-Sigma ADC 30 for converting an analog sum signal $S_A$ into a digital signal $S_D$. By the summation of the currents F1 to F8 by the node 29, the analog sum signal $S_A$ has all output signals F1 to F8 of the analog mixer 21, 22, 23, 24, 25, 26, 27, 28 as the summands. In particular embodiments, the input of the Delta-Sigma ADC 30 is differential in configuration. In particular embodiments, the Delta-Sigma ADC 30 is familiar in itself and it has, for example, a modulator and a filter/decimator (not shown in FIG. 2). In particular embodiments, the Delta-Sigma ADC 30 is configured, for example, for 100-fold oversampling. In particular embodiments, for example, the digital signal $S_D$ output from output 39 of the Delta-Sigma ADC 30 may have a word width as required for the requisite precision, such as 16 bits.

In particular embodiments, the circuit 1 of FIG. 2 has a control device 40 that is timed by a clock generator 90 with the clock signal CLK. In particular embodiments, the control device 40 has eight outputs 46 for outputting the oscillator signals $LO_{I1}$, $LO_{Q1}$, $LO_{I2}$, $LO_{Q2}$, $LO_{I3}$, $LO_{Q3}$, $LO_{I4}$, $LO_{Q4}$ that are connected to the mixers 21, 22, 23, 24, 25, 26, 27, 28.

In particular embodiments, the control device 40 may output first digital values $X_1(t)$ of a first sine function with the first frequency $f_1$ in time by the clock signal CLK at the output 49. The first sine function:

$$X_1(t)=\sin(2\pi f_1(t \times N_1(\text{CLK}))) \tag{1}$$

holds for the example embodiment of FIG. 2, where $N_1(\text{CLK})$ is every first clock pulse in a series of four clock pulses. In particular embodiments, the first sine function $X_1(t)$ belongs to the first oscillator signal $LO_{I1}$, has the same first frequency $f_1$, and is formed phase-locked to the first oscillator signal $LO_{I1}$.

In particular embodiments, the control device 40 may output second digital values $X_2(t)$ of a second sine function with the second frequency $f_2$ in time by the clock signal CLK at the output 49. The second sine function:

$$X_2(t)=\sin(2\pi f_2(t \times N_2(\text{CLX}))) \tag{2}$$

holds for the example embodiment of FIG. 2, where $N_2(\text{CLK})$ is every second clock pulse in a series of four clock pulses. In particular embodiments, the second sine function $X_2(t)$ belongs to the second oscillator signal $LO_{I2}$, has the same second frequency $f_2$, and is formed phase-locked to the second oscillator signal $LO_{I2}$.

In particular embodiments, the control device 40 may output third digital values $X_3(t)$ of a first cosine function with the first frequency $f_1$ in time by the clock signal CLK at the output 48. The first cosine function:

$$X_3(t)=\cos(2\pi f(t \times N_1(\text{CLK}))) \tag{3}$$

holds for the example embodiment of FIG. 2, where $N_1(\text{CLK})$ is every first clock pulse in a series of four clock pulses. In particular embodiments, the first cosine function $X_1(t)$ belongs to the third oscillator signal $LO_{Q1}$, has the same first frequency $f_1$, and is formed phase-locked to the third oscillator signal $LO_{Q1}$. In particular embodiments, the third digital values $X_3(t)$ are output with the same clock pulses as the first digital values $X_1(t)$.

In particular embodiments, the control device 40 may output fourth digital values $X_4(t)$ of a second cosine function with the second frequency $f_2$ in time by the clock signal CLK at the output 48. The second cosine function:

$$X_4(t)=\cos(2\pi f_2(t \times N_2(\text{CLK}))) \tag{4}$$

holds for the example embodiment of FIG. 2, where $N_2$(CLK) is every second clock pulse in a series of four clock pulses. In particular embodiments, the second cosine function $X_2(t)$ belongs to the fourth oscillator signal $LO_{Q2}$, has the same second frequency $f_2$, and is formed phase-locked to the fourth oscillator signal $LO_{Q2}$. In particular embodiments, the fourth digital values $X_4(t)$ are output with the same clock pulses as the second digital values $X_2(t)$.

In FIG. 2, the control device 40 may output values of the sine functions $X_5(t)$ and $X_7(t)$ belonging to the fifth oscillator signal $LO_{I3}$ and the seventh oscillator signal $LO_{I4}$, respectively, at the output 49. In particular embodiments, control device 40 may output values of the cosine functions $X_6(t)$ and $X_8(t)$ belonging to the sixth oscillator signal $LO_{Q3}$ and the eighth oscillator signal $LO_{Q4}$, respectively, at the output 48, in time, by the clock signal CLK.

Figure 3:
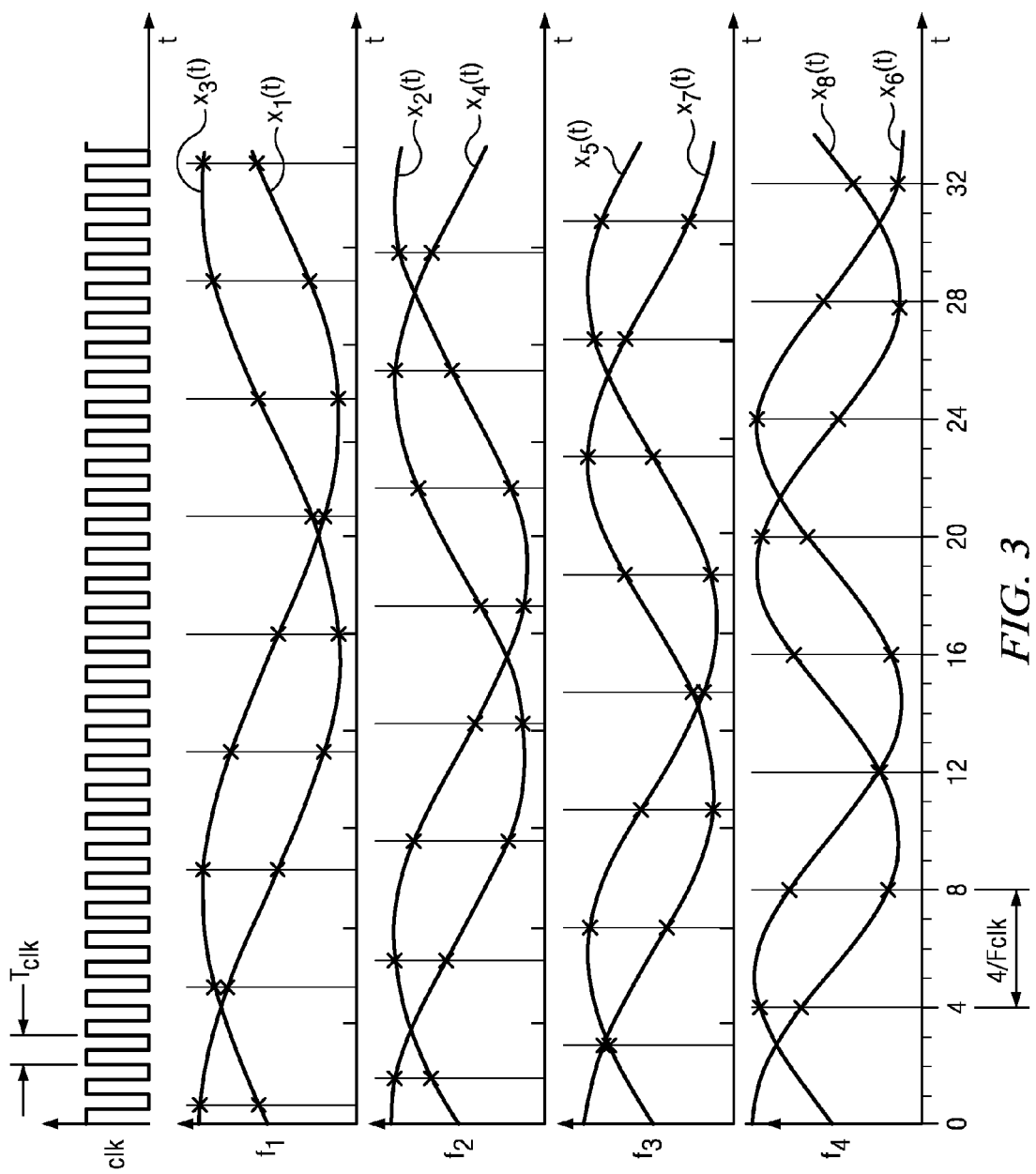
FIG. 3 is a schematic diagram for the second example embodiment.
Figure 4A:
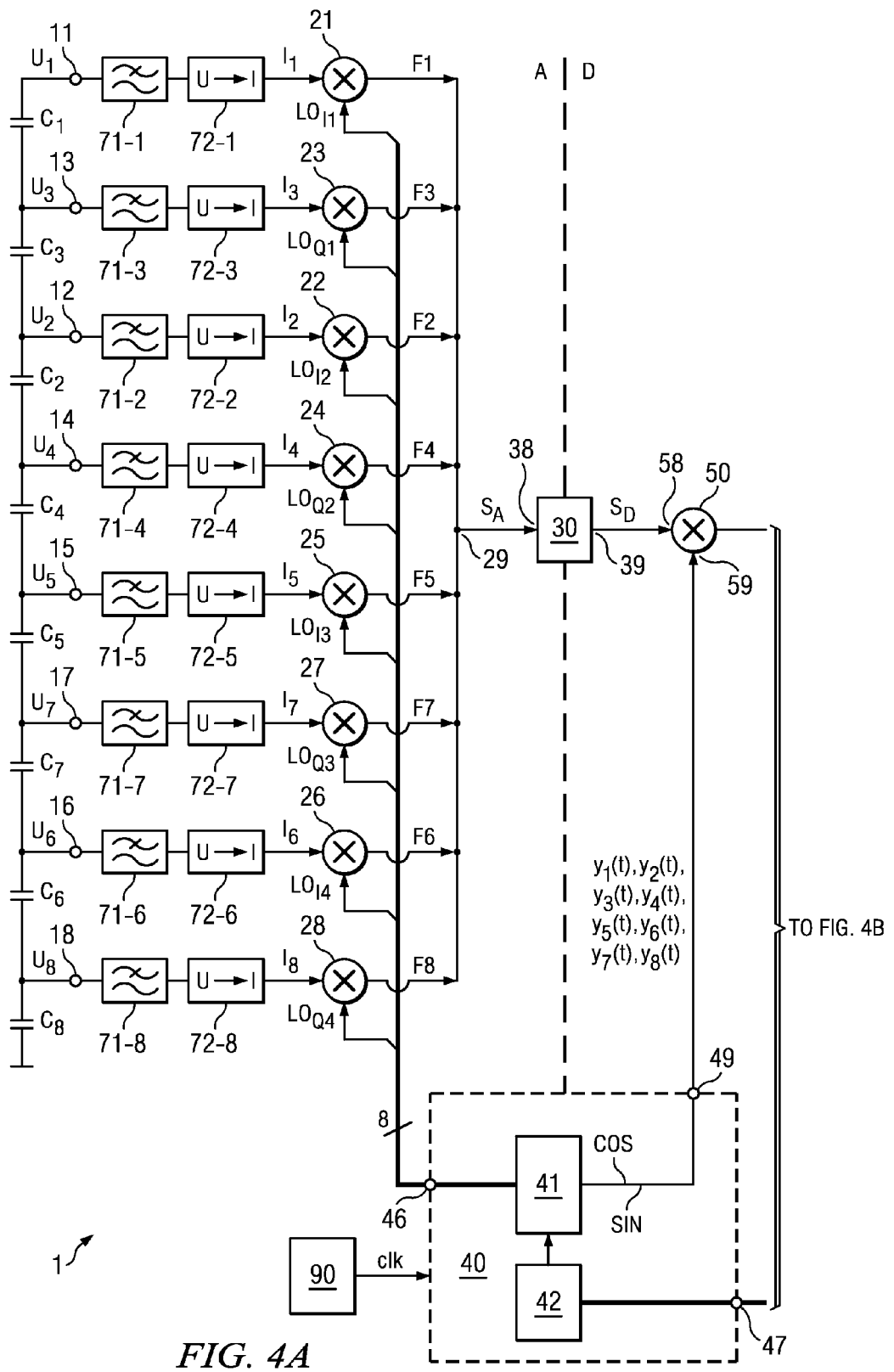
FIG. 4A is a portion of a schematic diagram of the third example embodiment.
Figure 4B:
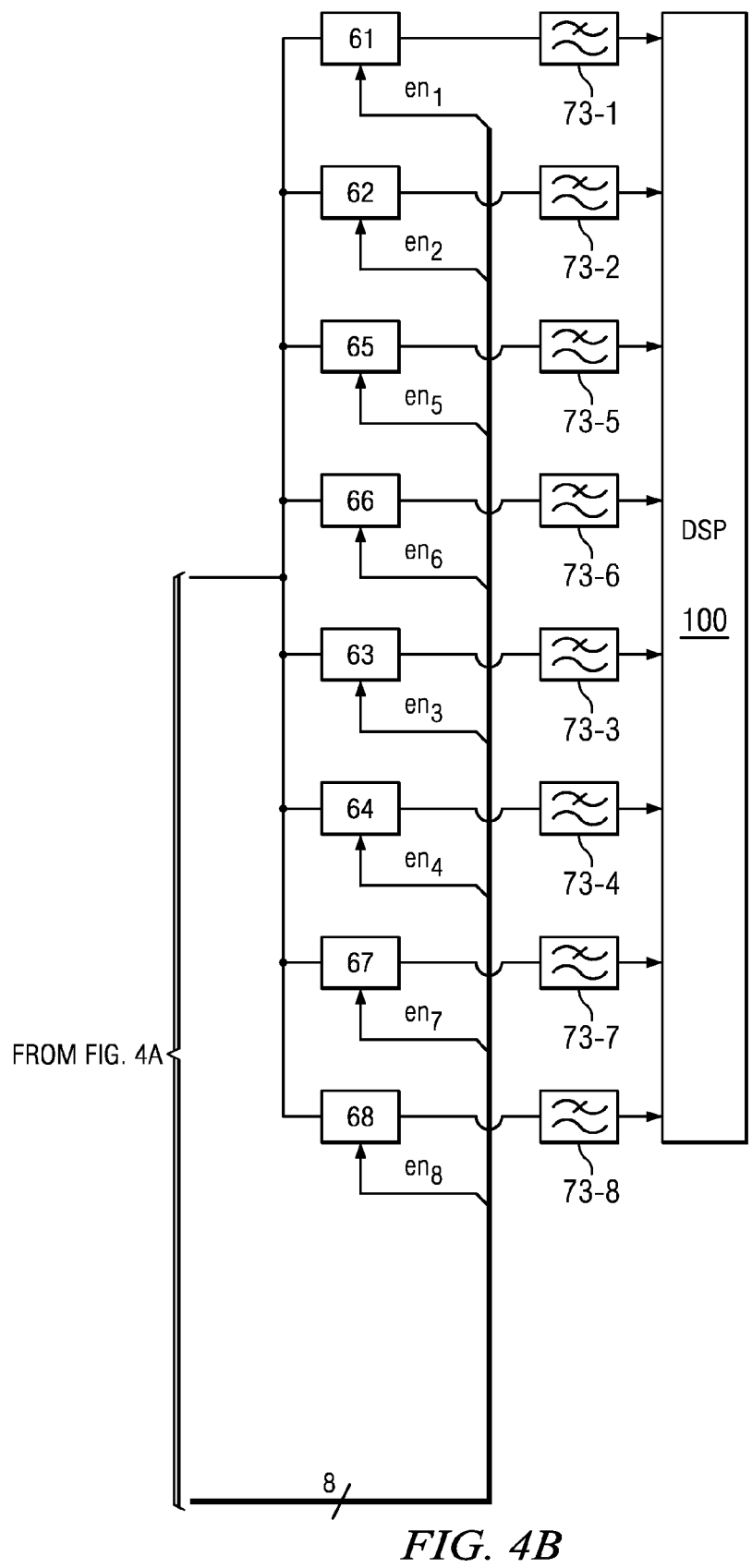
FIG. 4B is a second portion of a schematic diagram of the third example embodiment.

The values output are shown in a diagram in FIG. 3 as example functions of the time t. In the upper part of the diagram, the clock signal CLK is shown. Beneath the clock signal CLK are the curves of the first values $X_1(t)$ of the first sine function and the third values $X_3(t)$ of the first cosine function with frequency $f_1$ represented by crosses. Beneath the first and third values $X_1(t)$, $X_3(t)$ the curves of the second values $X_2(t)$ of the second sine function and the fourth values $X_4(t)$ of the second cosine function are shown with frequency $f_2$ and represented by crosses.

In particular embodiments, the control device 40 of FIG. 2 may output the second digital values $X_2(t)$ in time between the first digital values $X_1(t)$. In particular embodiments, the second values $X_2(t)$ are output offset in time by a clock period $T_{CLK}$ of the clock signal CLK after the first values $X_1(t)$. The fifth values $X_5(t)$ and sixth values $X_6(t)$ are likewise output between the first digital values $X_1(t)$. The values $X_1(t)$ to $X_8(t)$ are output in pairs with a clock period $T_{CLK}$ following each other in succession with a time spacing, as shown in FIG. 3.

In particular embodiments, the circuit 1 of FIG. 2 has a first digital multiplier 50 and a second digital multiplier 51. In particular embodiments, a first input 58 of the first digital multiplier 50 is connected to an output 39 of the Delta-Sigma ADC 30. In particular embodiments, a second input 59 of the first digital multiplier 50 is connected to a first output 49 of the control device 40, while the values $X_1(t)$, $X_2(t)$, $X_5(t)$, $X_6(t)$ of the sine functions are output at the first output 49 of the control device 40. In particular embodiments, the first digital multiplier 50 may multiply the digital signal $S_D$ with the first digital values $X_1(t)$ of the first sine function, the second digital values $X_2(t)$ of the second sine function, and accordingly with the fifth values $X_5(t)$ and sixth values $X_6(t)$.

In particular embodiments, a first input 56 of the second digital multiplier 51 is connected to an output 39 of the Delta-Sigma ADC 30. In particular embodiments, a second input 57 of the second digital multiplier 51 is connected to a second output 48 of the control device 40, while the values $X_3(t)$, $X_4(t)$, $X_7(t)$, $X_8(t)$ of the cosine functions are output at the second output 48 of the control device 40. In particular embodiments, the second digital multiplier 51 may multiply the digital signal $S_D$ with the third digital values $X_3(t)$ of the first cosine function, the fourth digital values $X_4(t)$ of the second cosine function, and accordingly with the seventh values $X_7(t)$ and eighth values $X_8(t)$.

In particular embodiments, the circuit 1 of FIG. 2 has a first register 61, a second register 62, a third register 63, a fourth register 64, a fifth register 65, a sixth register 66, a seventh register 67 and an eighth register 68. In particular embodiments, the registers 61, 62, 65, and 66 are connected to the output of the first digital multiplier 50. In particular embodiments, the registers 63, 64, 67 and 68 are connected to the output of the second digital multiplier 51. In particular embodiments, each register 61 to 68 is connected in series with a digital lowpass filter 73-1, 73-2, 73-3, 73-4, 73-5, 73-6, 73-7, and 73-8. In FIG. 2, for example, outputs of the registers 61-68 are connected across the filters 73-1 to 73-8 to an arithmetic unit 100, such as a digital signal processor (DSP). Each of the registers 61-68 belongs to the respective values $X_1(t)$-$X_8(t)$.

In particular embodiments, the control device 40 may place the results of the multiplication of the digital signal $S_D$ with the first digital values $X_1(t)$ in the first register 61 by controlling the first register 61 by means of a first control signal $en_1$ at the control output 47 and the results of the multiplication of the digital signal $S_D$ with the second digital values $X_2(t)$ in the second register 62 by controlling the second register 62 by means of a second control signal $en_2$ at the control output 47.

In particular embodiments, the control device 40 may place the results of the multiplication of the digital signal $S_D$ with the third digital values $X_3(t)$ in the third register 63 by controlling the third register 63 by means of a third control signal $en_3$ at the control output 47 and the results of the multiplication of the digital signal $S_D$ with the fourth digital values $X_4(t)$ in the fourth register 64 by controlling the fourth register 64 by means of a fourth control signal $en_4$ at the control output 47.

In particular embodiments, the first register 61 and the third register 63 are driven by the control signals $en_1$ and $en_3$ at the same time to store the values. Likewise, the second register 62 and the fourth register 64 are driven, in particular embodiments, by the control signals $en_2$ and $en_4$ at the same time to store the values. In particular embodiments, the registers 65 to 68 are driven by the control signals $en_5$, $en_6$, $en_7$, $en_8$.

In particular embodiments, the control device 40 has a generator 41 for generating the values $X_1(t)$ to $X_8(t)$ of the sine functions and cosine functions with the different frequencies $f_1$, $f_2$, $f_3$, $f_4$. In FIG. 2, the generator 41 may be formed as a hardware implementation of the CORDIC algorithm. The hardware implementation of the CORDIC algorithm is known in itself and not further explained in order to simplify the example embodiment in FIG. 2. In particular embodiments, the control device 40 may have two delay devices 44 and 45, in order to delay in time the generated sine values and cosine values for the outputting.

In particular embodiments, the control device 40 may generate squarewave signals as the oscillator signals $LO_{I1}$ to $LO_{Q4}$ for the mixers 21 to 28 from the sine values and cosine values by means of the most significant bit (MSB). In particular embodiments, the control device 40 may have another delay device 43 that delays, in time, the outputting of the generated oscillator signals $LO_{I1}$ to $LO_{Q4}$. In particular embodiments, the control device 40 may, by means of the delay devices 43, 44, 45, adjust the phases of the converted signals F1 to F8 that are contained in the digital signal $S_D$ to the phase of the values $X_1(t)$ to $X_8(t)$. In particular embodiments, for example, the values may be in the region of a 0° phase shift. In particular embodiments, the control device 40 has a logic 42 that may control the delay devices 43, 44, 45 and the registers 61, 62, 63, 64, 65, 66, 67, 68.

In particular embodiments, FIG. 4 shows a circuit 1 of a particular example embodiment in an example schematic block diagram. The example embodiment of FIG. 4 has many similarities with the example embodiment of FIG. 2. In particular embodiments, the analog side A of the circuit 1 for generating the differential sum signal $S_A$ is identical. In particular embodiments, any kind of ADC 30 may be used. In particular embodiments, for example, ADC 30 may use the weighing method, the parallel method, or any method having a sufficient bandwidth. In particular embodiments, the ADC 30 is a Delta-Sigma ADC.

In particular embodiments, the circuit 1 has on the digital side D precisely one digital multiplier 50 that multiplies all values $Y_1(t), Y_2(t), Y_3(t), Y_4(t), Y_5(t), Y_6(t), Y_7(t), Y_8(t)$ of all sine functions and all cosine functions of all frequencies with a digital signal $S_D$ output at the output 39 of the digital multiplier 50. In particular embodiments, in contrast with the example embodiment of FIG. 2, the values $Y_1(t)$ and $Y_3(t)$ of the sine function and the cosine function are output with the same frequency $f_1$, offset in time, at the output 49 of the control device 40.

In particular embodiments, the control device 40 may place the results of the multiplication of the digital signal $S_D$ with the digital values $Y_1(t), Y_2(t), Y_3(t), Y_4(t), Y_5(t), Y_6(t), Y_7(t), Y_8(t)$ in registers 61, 62, 63, 64, 65, 66, 67, 68 by controlling the respective registers 61, 62, 63, 64, 65, 66, 67, 68 by means of a control signal $en_1, en_2, en_3, en_4, en_5, en_6, en_7, en_8$ at the control output 47. In particular embodiments, the saved results of the multiplication are filtered by series-connected digital lowpass filters 73-1 to 73-8.

Figure 5:
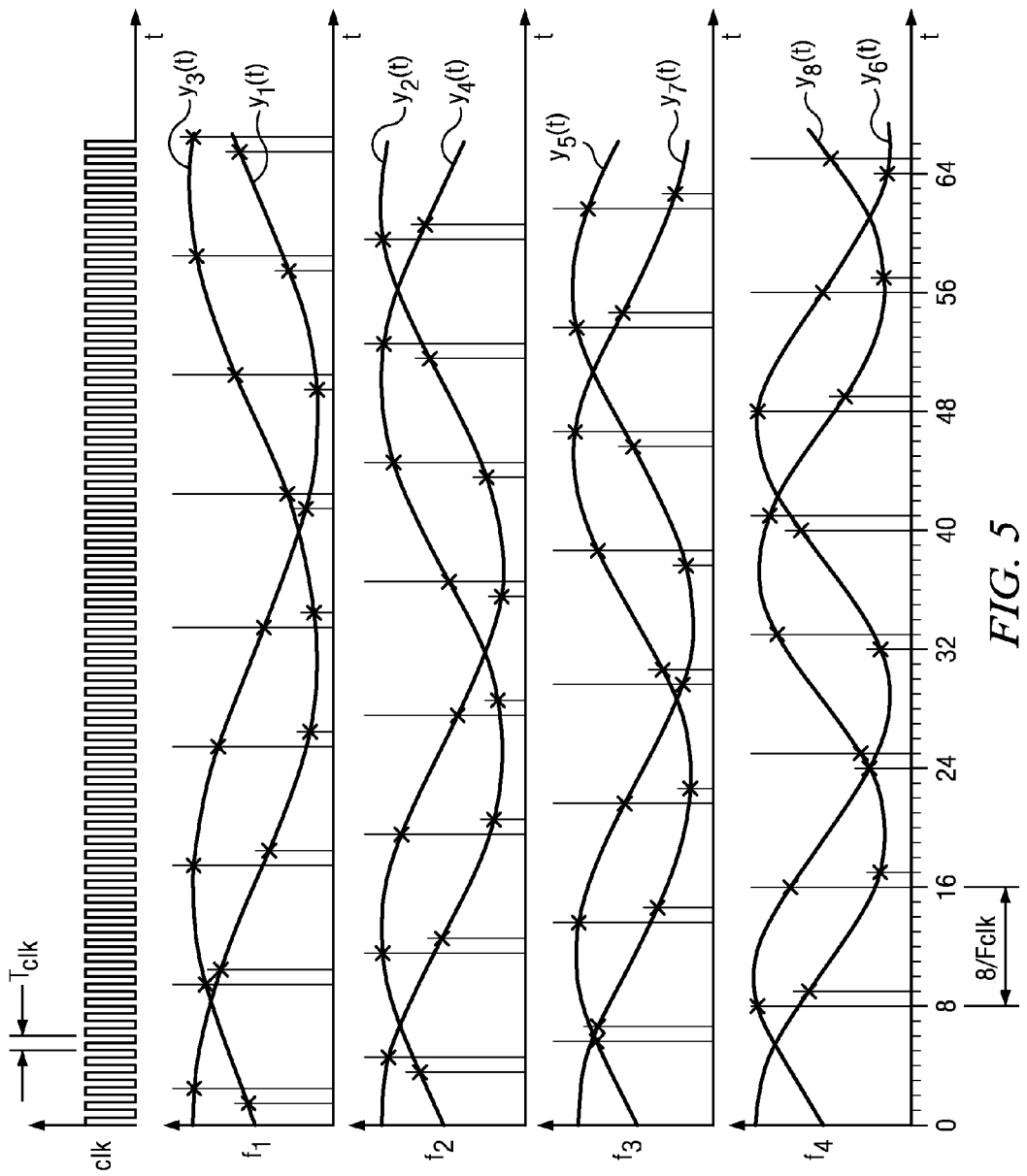
FIG. 5 is a schematic diagram for the third example embodiment.

In particular embodiments, all registers 61, 62, 63, 64, 65, 66, 67, 68 are driven to store values at different moments of time by the control signals $en_1, en_2, en_3, en_4, en_5, en_6, en_7, en_8$. An example diagram with the output digital values $Y_1(t), Y_2(t), Y_3(t), Y_4(t), Y_5(t), Y_6(t), Y_7(t), Y_8(t)$ is shown schematically in FIG. 5. In particular embodiments, the first values $Y_1(t)$ of the first sine function with the first frequency $f_1$ and the third values $Y_3(t)$ of the first cosine function with the first frequency $f_1$ are output offset from each other by a clock period $T_{CLK}$. The same holds for the values $Y_2(t), Y_4(t), Y_5(t), Y_6(t), Y_7(t), Y_8(t)$ of the sine functions and the cosine functions with the frequencies $f_2$, $f_3$ and $f_4$. In particular embodiments, the generator device 41 of the control device 40 of the sample embodiment of FIG. 4 may output all values $Y_1(t), Y_2(t), Y_3(t), Y_4(t), Y_5(t), Y_6(t), Y_7(t), Y_8(t)$ offset by at least one clock period $T_{CLK}$ of the clock signal CLK. In particular embodiments, in order to equalize the delay by the ADC 30, the generator device 41 of the control device 40 may adjust a phase rotation of the oscillator signals $LO_{I1}$ to $LO_{Q4}$ in relation to the corresponding values $Y_1(t), Y_2(t), Y_3(t), Y_4(t), Y_5(t), Y_6(t), Y_7(t), Y_8(t)$. In particular embodiments, the adjustment may be done automatically, for example, on the basis of measurement results.

Particular embodiments illustrated in FIGS. 1 to 5 comprise only a limited set of example embodiments and are shown to simplify the discussion. In particular embodiments, for example, it is possible to provide a larger or smaller number of analog inputs and corresponding mixers. In particular embodiments, the sequence of the values $X_1(t)$ to $X_8(t)$ of the sine function and the cosine function may also be changed and each time two values of the same function may be output. In particular embodiments, the functionality of the circuit 1 per FIG. 2 may be used with special advantage for a monitoring or metering of storage battery cells.

The following is a list of reference symbols and numbers in FIGS. 1 to 5, provided for example illustration purposes only and not by way of limitation:

| | |
|---|---|
| 1 | circuit |
| 11, 12, 13, 14, 15, 16, 17, 18 | analog input |
| 21, 22, 23, 24, 25, 26, 27, 28 | analog mixer, analog frequency converter |
| 29 | node |
| 30 | ADC, Delta-Sigma ADC |
| 38, 56, 57, 58, 59 | input |
| 39, 46, 47, 48, 49 | output |
| 40 | control device |
| 41 | generator, CORDIC |
| 42 | logic, state machine |
| 43, 44, 45 | delay device |
| 50, 51 | digital multiplier, digital mixer |
| 61, 62, 63, 64, 65, 66, 67, 68 | register |
| 71-1, 71-2, 71-3, 71-4, 71-5, 71-6, 71-7, 71-8 | analog lowpass filter |
| 72-1, 72-2, 72-3, 72-4, 72-5, 72-6, 72-7, 72-8 | analog voltage to current converter |
| 73-1, 73-2, 73-3, 73-4, 73-5, 73-6, 73-7, 73-8 | digital lowpass filter |
| 90 | clock signal generator |
| 100 | arithmetic unit |

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A circuit comprising:
   a first analog mixer configured to mix a first received analog signal with a first oscillator signal having a first frequency, the first oscillator signal received from a control device;
   a second analog mixer configured to mix a second received analog signal with a second oscillator signal having a second frequency, the second oscillator signal received from the control device;
   an analog-digital converter (ADC) configured to:
      convert a sum signal to a digital signal, the sum signal based on a first output of the first analog mixer and a second output of the second analog mixer; and
      output the digital signal to a digital multiplier;
   the control device configured to:
      output to the digital multiplier a first digital value of a first function having the first frequency and timed by a clock signal; and
      output to the digital multiplier a second digital value of a second function having the second frequency and timed by the clock signal, wherein the output of the first value and the second value are offset by a period of time;

a first register configured to receive a first control signal from the control device, the first control signal based on the first digital value and a digital signal output from the digital multiplier; and a second register configured to receive a second control signal from the control device, the second control signal based on the second digital value and the digital signal output from the digital multiplier.

2. The circuit of claim 1, wherein the control device is configured to:

output the first digital value and the first control signal at the same time; and output the second digital value and the second control signal at the same time.

3. The circuit of claim 1, wherein the control device comprises a generator device configured with a COordinate Rotation Digital Computer (CORDIC) algorithm for outputting the first and second digital values and the first and second oscillator signals.

4. The circuit of claim 1, further comprising:

a first analog input coupled to a first input circuit, the first analog input configured to input the first analog signal to the first analog mixer; and a second analog input coupled to a second input circuit, the second analog input configured to input the second analog signal to the second analog mixer.

5. The circuit of claim 4, further comprising:

a first battery coupled to the first analog input; and a second battery coupled to the second analog input.

6. The circuit of claim 4, wherein the first and second input circuits comprise an analog lowpass filter and a voltage to current converter.

7. The circuit of claim 1, wherein:

the first and second analog mixers coupled to one or more other analog mixers, each of the first and second analog mixers and other analog mixers coupled to the control device and the analog-digital converter (ADC);

the digital multiplier coupled to one or more other digital multipliers, each of the digital multiplier and other digital multipliers coupled to the analog-digital converter (ADC); and the first and second registers coupled to one or more other registers, each of the first and second registers and other registers coupled to the control device.

8. A method comprising:

receiving a first analog signal at a first input;

receiving a second analog signal at a second input;

mixing the first analog signal with a first oscillator signal having a first frequency;

mixing the second analog signal with a second oscillator signal having a second frequency;

converting a sum signal to a digital signal, the sum signal based on a first mixed analog signal and a second mixed analog signal;

generating a first control signal based on a first digital value of a first function and the digital signal; and generating a second control signal based on a second digital value of a second function and the digital signal.

9. The method of claim 8, wherein:

the first analog signal is received from a first battery; and the second analog signal is received from a second battery.

10. The method of claim 8, wherein the first and second digital values and the first and second oscillator signals are based on a COordinate Rotation Digital Computer (CORDIC) algorithm.

11. The method of claim 8, wherein:

the first digital value of the first function having the first frequency and timed by a clock signal; and the second digital value of the second function having the second frequency and timed by a clock signal.

12. The method of claim 11, wherein the first and second digital values are offset by a period of time.

13. A system comprising:

a plurality of analog mixers coupled to a control device and an analog-digital converter (ADC);

the analog-digital converter coupled to one or more digital multipliers;

the one or more digital multipliers coupled to the control device and a plurality of registers; and a plurality of analog inputs, each coupled to each of a plurality of input circuits, the plurality of analogy inputs configured to input analog signals to the each of the plurality of analog mixers.

14. The system claim 13, wherein the each of the plurality of input circuits comprising an analog lowpass filter and a voltage to current converter.

15. The system of claim 13, further comprising:

a plurality of batteries coupled to each of the analog input of the plurality of analog mixers.

16. The method of claim 8, comprising outputting to a first register the first control signal; and outputting to a second register the second control signal.

17. The method of claim 8, comprising:

outputting the first digital value and the first control signal at the same time; and outputting the second digital value and the second control signal at the same time.

18. The method of claim 8, comprising:

processing, prior to mixing the first analog signal, the first analog signal using a first analog lowpass filter and a first voltage to current converter; and processing, prior to mixing the second analog signal, the second analog signal using a second analog lowpass filter and a second voltage to current converter.

19. The method of claim 18, wherein:

the first analog lowpass filter and the second analog lowpass filter comprise the same analog lowpass filter; and the first voltage to current converter and the second voltage to current converter comprise the same voltage to current converter.

* * * * *

UNITED STATES PATENT AND TRADEMARK OFFICE
CERTIFICATE OF CORRECTION

PATENT NO.        : 8,552,899 B2                                    Page 1 of 1
APPLICATION NO.   : 13/236417
DATED             : October 8, 2013
INVENTOR(S)       : Lourans Samid It is certified that error appears in the above-identified patent and that said Letters Patent is hereby corrected as shown below:

In the claims

Col. 14, Ln. 25: After "of" and before "inputs" delete "analogy" and insert --analog--.

Signed and Sealed this
Twenty-first Day of April, 2015

Michelle K. Lee
*Director of the United States Patent and Trademark Office*